(12) United States Patent
Zhou et al.

(10) Patent No.: US 11,552,156 B2
(45) Date of Patent: Jan. 10, 2023

(54) ARRAY SUBSTRATE, DISPLAY PANEL, AND DISPLAY DEVICE WITH SEMICONDUCTOR LAYER DIRECTLY BELOW DATA LINES

(71) Applicant: SHENZHEN CHINA STAR OPTOELECTRONICS SEMICONDUCTOR DISPLAY TECHNOLOGY CO., LTD., Shenzhen (CN)

(72) Inventors: Shuai Zhou, Shenzhen (CN); Yan Xue, Shenzhen (CN)

(73) Assignee: SHENZHEN CHINA STAR OPTOELECTRONICS SEMICONDUCTOR DISPLAY TECHNOLOGY CO., LTD., Guangdong (CN)

(*) Notice: Subject to any disclaimer, the term of this patent is extended or adjusted under 35 U.S.C. 154(b) by 128 days.

(21) Appl. No.: 16/980,398

(22) PCT Filed: Apr. 23, 2020

(86) PCT No.: PCT/CN2020/086436
§ 371 (c)(1),
(2) Date: Sep. 13, 2020

(87) PCT Pub. No.: WO2021/184488
PCT Pub. Date: Sep. 23, 2021

(65) Prior Publication Data
US 2021/0288125 A1    Sep. 16, 2021

(30) Foreign Application Priority Data

Mar. 16, 2020 (CN) .......................... 202010179835.3

(51) Int. Cl.
*H01L 27/32* (2006.01)

(52) U.S. Cl.
CPC .............................. *H01L 27/3276* (2013.01)

(58) Field of Classification Search
CPC .................................................. H01L 27/3276
See application file for complete search history.

(56) References Cited

U.S. PATENT DOCUMENTS

| | | | |
|---|---|---|---|
| 2003/0094895 A1* | 5/2003 | Okuyama | H01L 27/3279 313/506 |
| 2003/0128178 A1* | 7/2003 | Murade | G02F 1/136286 345/87 |
| 2010/0244038 A1* | 9/2010 | Ro | H01L 21/02532 257/E21.414 |
| 2012/0050235 A1* | 3/2012 | Park | H01L 27/3276 257/E33.012 |

(Continued)

FOREIGN PATENT DOCUMENTS

| | | |
|---|---|---|
| CN | 101377594 A | 3/2009 |
| CN | 104282259 A | 1/2015 |

(Continued)

*Primary Examiner* — Lex H Malsawma
(74) *Attorney, Agent, or Firm* — PV IP PC; Wei Te Chung; Ude Lu

(57) ABSTRACT

An array substrate, a display panel, and a display device are provided. The array substrate includes a substrate, a semiconductor layer, a gate insulation layer, a gate layer, an interlayer insulation layer, and data lines, wherein the semiconductor layer is directly below the data lines.

9 Claims, 2 Drawing Sheets

(56) References Cited

U.S. PATENT DOCUMENTS

| | | | | |
|---|---|---|---|---|
| 2017/0125441 A1* | 5/2017 | Jian | ................... | H01L 29/78696 |
| 2017/0125442 A1* | 5/2017 | Jian | ....................... | G02F 1/1368 |
| 2017/0278917 A1* | 9/2017 | Kim | ................... | H01L 27/3276 |

FOREIGN PATENT DOCUMENTS

| | | |
|---|---|---|
| CN | 104749838 A | 7/2015 |
| CN | 105137679 A | 12/2015 |
| CN | 105140246 A | 12/2015 |
| KR | 20160139691 A | 12/2016 |

* cited by examiner

ARRAY SUBSTRATE, DISPLAY PANEL, AND DISPLAY DEVICE WITH SEMICONDUCTOR LAYER DIRECTLY BELOW DATA LINES

FIELD OF INVENTION

The present disclosure relates to the field of display, and in particular, to an array substrate, a display panel, and a display device.

BACKGROUND OF INVENTION

As a requirement for pixel density in organic light-emitting diode (OLED) display panels increases, a size of the pixel is gradually reduced, such that design space in the pixel is compressed. Hence, in the limited space, realizing rational designs of array substrates has become an important consideration.

Currently, optimization of manufacturing processes is an important consideration. By shortening a width of metal lines and a distance between the metal lines, more space meets designing requirements for the array substrates. However, the optimization of the manufacturing processes is affected by equipment capacities and panel yield, so a degree of the optimization is limited.

FIG. 1 is a schematic view of an array substrate of a display device in conventional technology. A semiconductor layer 10 is located at the bottom. A gate layer 20 is disposed on the semiconductor layer and is perpendicular to the semiconductor layer 10. Data lines 30 are disposed at the top and include longitudinal data lines and transverse data lines, and wherein a linear direction of the longitudinal data lines is parallel to a linear direction of the semiconductor layer, and a linear direction of the transverse data lines is perpendicular to the linear direction of the semiconductor layer. The semiconductor layer 10 and the data lines 30 are not configured in the same vertical plane, such that the space occupied by the pixels is relatively large, which not adapts to the current requirements for the high pixel density.

Therefore, the optimization in design, which allows to improve space utilization of the pixel, has become an important consideration.

SUMMARY OF INVENTION

Technical Problem

A purpose of the present disclosure is to solve a technical problem that pixels in conventional display devices occupy relatively large space, thus being difficult to meet requirements for high pixel density in the display devices.

Technical Solutions

In order to realize the above-mentioned purpose, the present disclosure provides an array substrate including: a substrate; a semiconductor layer disposed on a surface of the substrate; a gate insulation layer disposed on a surface of the semiconductor layer away from the substrate; a gate layer disposed on a surface of the gate insulation layer away from the semiconductor layer; an interlayer insulation layer disposed on the substrate and covering the gate layer, the gate insulation layer, and the semiconductor layer; and a plurality of data lines disposed on the interlayer insulation layer and penetrating the interlayer insulation layer to connect with the semiconductor layer; wherein the semiconductor layer is directly below the data lines.

Furthermore, the gate layer is perpendicular to the semiconductor layer.

Furthermore, the array substrate further includes: a first inorganic layer disposed between the substrate and the semiconductor layer; and a second inorganic layer disposed on the data lines and a surface of the interlayer insulation layer away from the first inorganic layer.

Furthermore, the gate layer is perpendicular to the data lines.

Moreover, in a region on which the semiconductor layer is located, a projection of the data lines projected on the substrate completely is completely within a projection of the semiconductor layer projected on the substrate.

Furthermore, a length direction of the data lines is parallel to a length direction of the semiconductor layer.

Moreover, the data lines are also drain lines.

In order to realize the above-mentioned purpose, the present disclosure further provides a display panel including a first array substrate and a second substrate. The first array substrate is the array substrate as described above, and a source of the first array substrate is connected to a gate layer of the second array substrate.

Furthermore, the first array substrate includes a switching thin-film transistor, and the second array substrate includes a driving thin-film transistor.

In order to realize the above-mentioned purpose, the present disclosure further provides a display device including the display panel as described above.

Advantageous Effects

The advantageous effects of the present disclosure are that the semiconductor layer is disposed directly below the data lines without reserving the design space of the display panel inside the pixels in advance, so that the space occupied by the single pixel in the display panel may be significantly saved, thus improving space utilization of the pixel and further meeting the requirements for the high pixel density in the display devices.

DESCRIPTION OF DRAWINGS

In combination with accompanying drawings below, technical solutions and other advantageous effects of the present disclosure will be apparent by describing specific embodiments of the present disclosure in detail.

Figure 1:
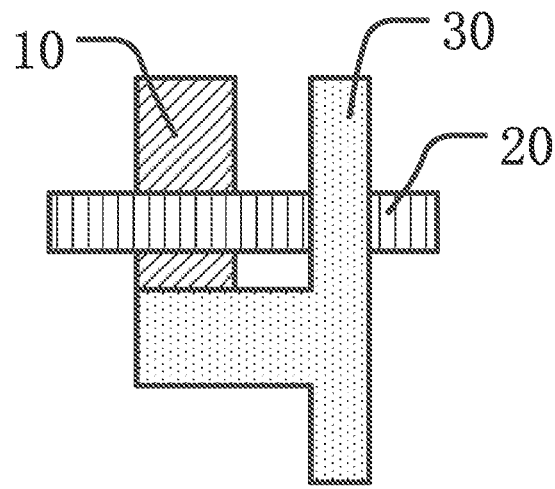
FIG. 1 is a schematic view of an array substrate in conventional technology.

A part of components is marked as follows:
10 semiconductor layer; 20 gate layer; 30 data line;
100 first array substrate; 200 second array substrate;
1 substrate; 2 first inorganic layer; 3 semiconductor layer; 4 gate insulation layer; 5 gate layer; 6 interlayer insulation layer; 7 data line; 8 second inorganic layer;
21 substrate; 22 first inorganic layer; 23 semiconductor layer; 24 gate insulation layer; 25 gate layer; 26 interlayer insulation layer; 27 source line; 28 second inorganic layer.

DETAILED DESCRIPTION OF PREFERRED EMBODIMENTS

In combination with accompanying drawings in embodiments of the present disclosure below, technical solutions in the embodiments of the present disclosure are clearly and completely described. Obviously, the described embodiments are merely a part of the embodiments of the present disclosure, rather than all the embodiments. Based on the embodiments in the present disclosure, all of other embodiments obtained by those skilled in the art without making for creative efforts belong to the scope protected by the present disclosure.

In the description of the present disclosure, it should be understood that indicative directions or position relations, such as terms "center", "longitudinal", "transverse", "length", "width", "thickness", "upper", "lower", "front", "back", "left", "right", "vertical", "horizontal", "top", "bottom", "inner", "outer", "clockwise", and "counterclockwise", are based on directions or position relations indicated by the accompanying drawings. The indicative directions or position relations are only for convenience of describing the present disclosure and simplifying the description, and do not indicate or imply that indicated devices or elements must have a specific orientation and be constructed and operated in a specific orientation. Therefore, the indicative directions or position relations cannot be understood to be limitation to the present disclosure. In addition, terms, such as "first" and "second", are only used for purposes of description, and do not be understood to indicate or imply relative importance or to imply numbers of indicated technical features. Thus, the features defined with "first" and "second" may explicitly or implicitly include one or more of the features. In the description of the present disclosure, term "a plurality of" means two or more than two, unless specified otherwise.

In the description of the present disclosure, it should be noted that unless specified or limited otherwise, terms "mounted", "linked", and "connected" are understood broadly, and may be, for example, fixed connection, detachable connection or integral connection; may be mechanical connection or electrical connection or may communicate with each other; may be direct connection or indirect connection via intermediate media; may be inner communication of two elements or interaction between two elements. For those of ordinary skill in the art, the specific meaning of the above-mentioned terms may be understood according to specific situations.

In the present disclosure, unless specified or limited otherwise, a structure in which a first feature is "on" or "below" a second feature may include direct contact between the first feature and the second feature, and may also include indirect contact between the first feature and the second feature via additional features formed therebetween. Moreover, a structure in which the first feature "on," "above," or "on top of" the second feature may include a structure in which the first feature is directly or obliquely above the second feature, or merely means that a height of the first feature is higher than a height of the second feature, and a structure in which the first feature "below," "under," or "on bottom of" the second feature may include a structure in which the first feature is directly or obliquely under the second feature, or merely means that a height of the first feature is lower than a height of the second feature.

Various embodiments and examples are provided in the following disclosure to realize different structures of the present disclosure. In order to simplify the present disclosure, components and settings of the particular examples are described below. However, these components and settings are only by way of example, and are not intended to limit the present disclosure. In addition, reference numerals may be repeated in different examples in the present disclosure. This repeating is for the purposes of simplification and clarity, and does not refer to relations between various embodiments and/or settings. Furthermore, examples of various particular processes and materials are provided in the present disclosure, but those of ordinary skill in the art may appreciate applications of other processes and/or use of materials.

Figure 2:
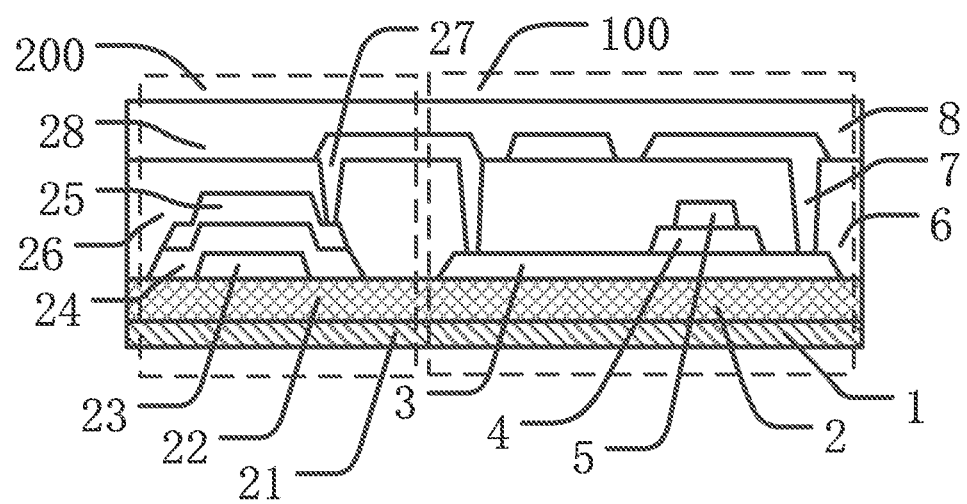
FIG. 2 is a structural schematic view of a display panel described in embodiments of the present disclosure.
Figure 3:
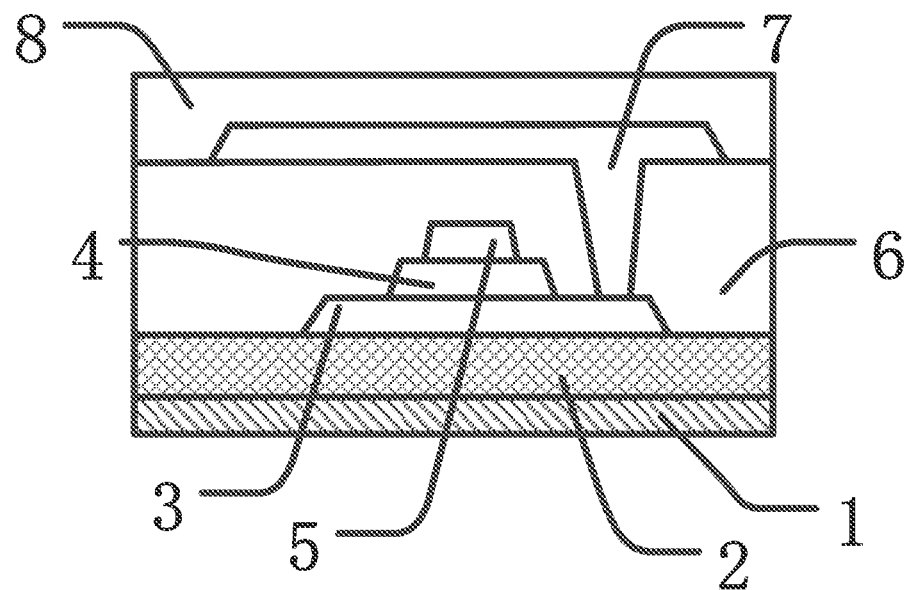
FIG. 3 is a cross-sectional view of an array substrate described in embodiments of the present disclosure.
Figure 4:
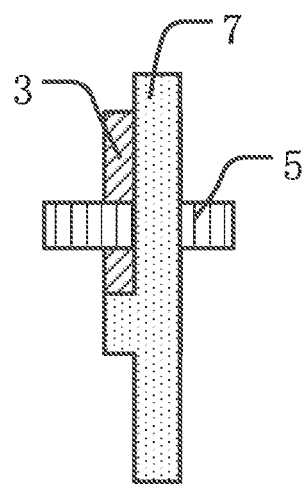
FIG. 4 is a partial schematic view of the array substrate described in embodiments of the present disclosure.

Specifically, with reference to FIG. 2 to FIG. 4, the embodiments of the present disclosure provide a display device including a display panel. Specifically, as shown in FIG. 2, the display panel includes a first array substrate 100 and a second array substrate 200.

The first array substrate 100 includes a switching thin-film transistor (Switching TFT), and the second array substrate 200 includes a driving thin-film transistor (Driving TFT). Work principles of the switching thin-film transistor and the driving thin-film transistor are that: after scan lines of the display panel are driven, the switching thin-film transistor is turned on, and signals are input into a capacitor from data lines; after the capacitor is charged, a power supply supplies current based on a current-voltage characteristic of the driving thin-film transistor and a potential of the capacitor to drive the display panel.

As shown in FIG. 3, the first array substrate 100 includes a substrate 1, a first inorganic layer 2, a semiconductor layer 3, a gate insulation layer 4, a gate layer 5, an interlayer insulation layer 6, data lines 7, and a second inorganic layer 8.

The substrate 1 is a rigid substrate, generally a glass substrate, to play a supporting role and a base role.

The first inorganic layer 2 is disposed on an upper surface of the substrate 1 to play a buffering role, so the first inorganic layer is also called a buffer layer. Material of the first inorganic layer 2 is an inorganic material including silicon oxide, or silicon nitride, or a multilayer structure.

The semiconductor layer 3 is disposed on an upper surface of the first inorganic layer 2. A length direction of the semiconductor layer 3 is parallel to a length direction of the data lines 7, the length direction of the semiconductor layer 3 is perpendicular to a length direction of the gate layer 5. The semiconductor layer 3 provides circuit support for the display panel. Material of the semiconductor layer 3 is a semiconductor material including indium gallium zinc oxide (IGZO), indium gallium titanium oxide (IZTO), and indium gallium zinc titanium oxide (IGZTO).

The gate insulation layer 4 is disposed on an upper surface of the semiconductor layer 3. Material of the gate insulation layer 4 is an inorganic material including silicon oxide, or silicon nitride, or a multilayer structure. The gate insulation layer 4 is arranged opposite to the semiconductor layer 3. The gate insulation layer 4 plays an insulating role to prevent short circuit between various lines inside the display panel.

The gate layer 5 is disposed in an upper surface of the gate insulation layer 4, and the gate layer 5 is arranged opposite to the gate insulation layer 4. The length direction of the gate layer 5 is perpendicular to the length direction of the semiconductor layer 3, and the length direction of the gate layer 5 is perpendicular to the length direction of the data lines 7. Material of the gate layer 5 is a metal material including molybdenum (Mo), aluminum (Al), copper (Cu), titanium (Ti), and the like, or alloys, or a multilayer thin film structure.

The interlayer insulation layer 6 is disposed on upper surfaces of the gate layer 5, the gate insulation layer 4, the semiconductor layer 3, and the first inorganic layer 2. Material of the interlayer insulation layer 6 is an inorganic material including silicon oxide, or silicon nitride, or a multilayer structure, which plays the insulating role to prevent the short circuit of the circuits. A through-hole is provided above the semiconductor layer 3, and the through-hole facilitates electrical connection between the data lines 7 and the semiconductor layer 3.

The data lines 7 are disposed on an upper surface of the interlayer insulation layer 6. The length direction of the data lines 7 is parallel to the length direction of the semiconductor layer 3, and the length direction of the data lines 7 is perpendicular to the length direction of the gate layer 5. Material of the data lines includes metal materials including molybdenum (Mo), aluminum (Al), copper (Cu), titanium (Ti), and the like, or alloys, or a multilayer thin film structure. Some of the metal materials is provided inside the through-hole. The data lines 7 are electrically connected to the semiconductor layer 3 via the through-hole to form drain lines of the switching thin-film transistor. Source lines 27 of the array substrate are connected with a gate layer 25 of the driving thin-film transistor.

The second inorganic layer 8 is disposed on upper surfaces of the interlayer insulation layer 6 and the data lines 7. The second inorganic layer 8 may be a passivation layer, and material of the second inorganic layer 8 includes silicon oxide material. The second inorganic layer 8 plays an insulating role and a role of isolating external water and oxygen.

As shown in FIG. 4, the semiconductor layer 3 is directly below the data line 7. In a region in which the semiconductor layer 3 is located, a projection of the data line 7 projected on the substrate 1 is completely within a projection of the semiconductor layer 3 projected on the substrate 1. Since the data lines 7 are connected with rows of pixels of the display panel, a length of the data lines is greater than a length the semiconductor layer 3. The length direction of the semiconductor 3 is parallel to the length direction of the data lines 7, the length direction of the semiconductor 3 is perpendicular to the length direction of the gate layer 5, and the length direction of the gate layer 5 is perpendicular to the length direction of the data lines 7.

The semiconductor layer 3 is disposed directly below the data line 7 without reserving design space of the display panel inside the pixels in advance, so that the space occupied by the single pixel in the display panel may be significantly saved, thus improving space utilization of the pixel.

In conventional technology, space occupied by a switching thin-film transistor is designed to be about 320 $\mu m^2$. Taking a 31 inch UD 145PPI pixel as an example, an area of a sub-pixel is 10267 $\mu m^2$, so the space which can be saved is 3.2%. However, at present, the display panels with high pixel density are a development trend of the current display panels. As a requirement for the high pixel density increases, an area of the pixel is rapidly decreased, and the effect of the display device described in the embodiments on saving the design space will become more and more apparent. For example, when the requirement for the pixel density is doubled, the area of the sub-pixel has become 25% of the original area, and a ratio of the saved space in the array substrate to the designing pixel space will be increased to 12.8%, so that the space utilization of the pixel may be significantly increased, and the requirement for the high pixel density may be realized.

The second array substrate 200 includes a substrate 21, a first inorganic layer 22, a semiconductor layer 32, a gate insulation layer 24, a gate layer 25, an interlayer insulation layer 26, source lines 27, and a second inorganic layer 28.

The substrate 21 is a rigid substrate, generally a glass substrate, to play a supporting role and a base role.

The first inorganic layer 22 is disposed on an upper surface of the substrate 21 to play a buffering role, so the first inorganic layer is also called a buffer layer. Material of the first inorganic layer 22 is an inorganic material including silicon oxide, or silicon nitride, or a multilayer structure.

The semiconductor layer 23 is disposed on an upper surface of the first inorganic layer 22. Material of the semiconductor layer 23 is a semiconductor material including indium gallium zinc oxide (IGZO), indium gallium titanium oxide (IZTO), and indium gallium zinc titanium oxide (IGZTO).

The gate insulation layer 24 covers an upper surface of the semiconductor layer 23. Material of the gate insulation layer 24 is an inorganic material including silicon oxide, or silicon nitride, or a multilayer structure. The gate insulation layer 24 plays an insulating role to prevent short circuit between various lines inside the display panel.

The gate layer 25 covers an upper surface of the gate insulation layer 24, and the gate layer 25 is arranged opposite to the gate insulation layer 24. Material of the gate layer 25 is a metal material including molybdenum (Mo), aluminum (Al), copper (Cu), titanium (Ti), and the like, or alloys, or a multilayer thin film structure.

The interlayer insulation layer 26 is disposed on upper surfaces of the gate layer 25, the gate insulation layer 24, the semiconductor layer 23, and the first inorganic layer 22. Material of the interlayer insulation layer 26 is an inorganic material including silicon oxide, or silicon nitride, or a multilayer structure, which plays the insulating role to prevent the short circuit of the circuits. A through-hole is provided above the semiconductor layer 3, and the through-hole facilitates electrical connection between the source lines 27 and the semiconductor layer 23.

A metal layer is disposed on an upper surface of the interlayer insulation layer 26. An end of the metal layer penetrates the interlayer insulation layer 26 to electrically connect with the gate layer 25, and the other end penetrate the interlayer insulation layer 6 of the first array substrate 100 to electrically connect with the semiconductor layer 3 of the first array substrate 100 to form drain lines.

The second inorganic layer 28 is disposed on upper surfaces of the interlayer insulation layer 26 and the source lines 27. The second inorganic layer 28 may be a passivation layer, and material of the second inorganic layer 28 includes silicon oxide material. The second inorganic layer 28 plays an insulating role and a role of isolating external water and oxygen.

The technical effects of the display device described in the embodiments are that the semiconductor layer is disposed directly below the data lines without reserving the designing space of the display panel inside the pixels in advance, so that the space occupied by the single pixel in the display panel may be significantly saved, thus improving the space utilization of the pixel and further meeting the requirements for the high pixel density in the display devices.

In the foregoing embodiments, the description for the embodiments emphasizes different aspects. For a part without being described in detail in a certain embodiment, reference may be made to related description in other embodiments.

The above context introduces an array substrate, a display panel, and a display device provided by the embodiments of the present disclosure in detail. Specific examples herein are used to explain the principles and the implementation of the present disclosure. The illustration of the foregoing embodiments is only used to facilitate understanding the technical solutions and the core ideas of the present disclosure. Those skilled in the art should understand that: the technical solutions described in the foregoing embodiments can still be modified, or some of the technical features can be equivalently replaced, and these modifications or replacements do not make the essence of the corresponding technical solutions depart from the scope of the technical solutions of various embodiments of the present disclosure.

What is claimed is:

1. An array substrate, comprising:
   a substrate;
   a semiconductor layer disposed on a surface of the substrate;
   a gate insulation layer disposed on a surface of the semiconductor layer away from the substrate;
   a gate layer disposed on a surface of the gate insulation layer away from the semiconductor layer;
   an interlayer insulation layer disposed on the substrate and covering the gate layer, the gate insulation layer, and the semiconductor layer; and
   a plurality of data lines disposed on the interlayer insulation layer and penetrating the interlayer insulation layer to connect with the semiconductor layer;
   wherein the semiconductor layer is directly below the data lines,
   wherein in a region in which the semiconductor layer is located, a projection of the data lines projected on the substrate is completely within a projection of the semiconductor layer projected on the substrate.

2. The array substrate according to claim 1, wherein the gate layer is perpendicular to the semiconductor layer.

3. The array substrate according to claim 1, further comprising:
   a first inorganic layer disposed between the substrate and the semiconductor layer; and
   a second inorganic layer disposed on the data lines and a surface of the interlayer insulation layer away from the first inorganic layer.

4. The array substrate according to claim 3, wherein the gate layer is perpendicular to the data lines.

5. The array substrate according to claim 1, wherein a length direction of the data lines is parallel to a length direction of the semiconductor layer.

6. The array substrate according to claim 1, wherein the data lines are also drain lines.

7. A display panel, comprising: a first array substrate and a second substrate;
   wherein the first array substrate is the array substrate according to claim 1; and
   wherein a source of the first array substrate is connected to a gate layer of the second array substrate.

8. The display panel according to claim 7, wherein
   the first array substrate includes a switching thin-film transistor; and
   the second array substrate includes a driving thin-film transistor.

9. A display device, comprising: the display panel according to claim 7.

* * * * *